US012757331B2

(12) United States Patent
Liou

(10) Patent No.: US 12,757,331 B2
(45) Date of Patent: Oct. 6, 2026

(54) ELECTRONIC DEVICE

(71) Applicant: CARUX TECHNOLOGY PTE. LTD., Singapore (SG)

(72) Inventor: You-Ren Liou, Tainan (TW)

(73) Assignee: CARUX TECHNOLOGY PTE. LTD., Singapore (SG)

(*) Notice: Subject to any disclaimer, the term of this patent is extended or adjusted under 35 U.S.C. 154(b) by 327 days.

(21) Appl. No.: 18/401,880

(22) Filed: Jan. 2, 2024

(65) Prior Publication Data

US 2024/0237214 A1 Jul. 11, 2024

(30) Foreign Application Priority Data

Jan. 6, 2023 (CN) ......................... 202310018172.0

(51) Int. Cl.

| | |
|---|---|
| ***H05K 1/14*** | (2006.01) |
| ***H05K 5/00*** | (2025.01) |
| ***H05K 5/02*** | (2006.01) |
| ***H05K 7/14*** | (2006.01) |

(52) U.S. Cl.

CPC ............. *H05K 1/148* (2013.01); *H05K 1/142* (2013.01); *H05K 5/0069* (2013.01); *H05K 5/0221* (2013.01); *H05K 5/0247* (2013.01)

(58) Field of Classification Search

CPC ........ H05K 1/148; H05K 1/142; H05K 1/144; H05K 5/0069; H05K 5/0221; H05K 5/0247; H05K 7/1422; H05K 7/1427

See application file for complete search history.

(56) References Cited

U.S. PATENT DOCUMENTS

| | | | |
|---|---|---|---|
| 8,144,473 | B2 | 3/2012 | Yumoto et al. |
| 2010/0014250 | A1 | 1/2010 | Kitahara |
| 2019/0130519 | A1 | 5/2019 | Hu et al. |

FOREIGN PATENT DOCUMENTS

| | | | |
|---|---|---|---|
| JP | 2012222168 | A | * 11/2012 |
| TW | 200531603 | A | 9/2005 |

* cited by examiner

*Primary Examiner* — Timothy J Thompson
*Assistant Examiner* — Amol H Patel
(74) *Attorney, Agent, or Firm* — JCIPRNET

(57) ABSTRACT

An electronic device is provided, including a main structure, a fixed member, a first circuit board, and a second circuit board. The main structure includes a first fixing position and a second fixing positing, and the fixed member is affixed to the first fixing position and the second fixing position. The first circuit board and the second circuit board are disposed on the main structure, and they overlap each other. The fixed member is disposed between the first circuit board and the second circuit board.

18 Claims, 4 Drawing Sheets

ELECTRONIC DEVICE

CROSS REFERENCE TO RELATED APPLICATIONS

This application claims the benefit of China Patent Application No. 202310018172.0, filed Jan. 6, 2023, the entirety of which is incorporated by reference herein.

BACKGROUND OF THE DISCLOSURE

Field of the Disclosure

The application relates in general to an electronic device, and in particular, to an electronic device having a fixed member that is configured to separate circuit boards.

Description of the Related Art

For people with modern lifestyles, electronic products are indispensable tools, used for work, learning, and entertainment.

The customer expects the appearance of an electronic product to be thinner and lighter, or that it be flexible, to meet his needs. However, the electronic components inside of such an electronic product can easily interfere with each other due to the miniaturization of said electronic product. Therefore, how to address the aforementioned problem has become an important issue.

BRIEF SUMMARY OF DISCLOSURE

An embodiment of the disclosure provides an electronic device, including a main structure, a fixed member, a first circuit board, and a second circuit board. The main structure includes a first fixing position and a second fixing positing, and the fixed member is affixed to the first fixing position and the second fixing position. The first circuit board and the second circuit board are disposed on the main structure, and they overlap each other. The fixed member is disposed between the first circuit board and the second circuit board.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSURE

Figure 1:
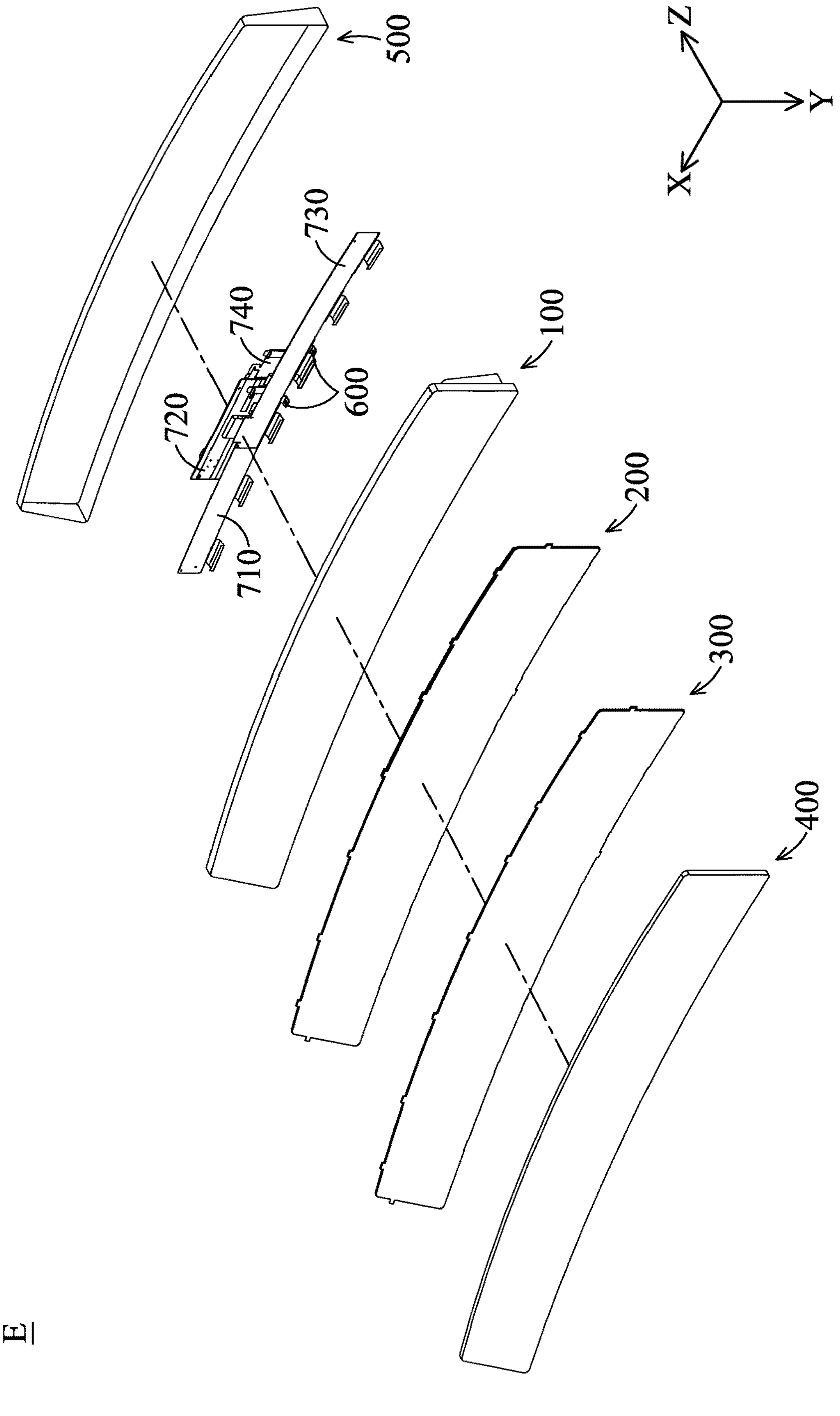
FIG. 1 is a schematic diagram of an electronic device according to an embodiment of the disclosure.

The making and using of the embodiments of the electronic device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

In addition, in this specification, relative expressions are used. For example, "below" and "above" are used to describe the position of one element relative to another. It should be appreciated that if a device is flipped upside down, an element that is "below" will become an element that is "above".

When the corresponding component (such as layer or area) is referred to "on another component (or the variant thereof)", it may be directly on another component, or other component may exist between them. On the other hand, when the component is referred to "directly on another component (or the variant thereof)", any component does not exist between them. Moreover, when a component is referred to "on another component (or the variant thereof)", the component and the other component has a positional relationship in a top view direction, the component can be disposed above or below the other component, and the positional relationship is based on the orientation of the device.

In some embodiments of the disclosure, terms concerning attachments, coupling and the like, such as "connected", refer to a relationship wherein structures are secured or attached to one another either directly or indirectly through intervening structures, unless expressly described otherwise.

It should be understood that, although the terms "first", "second", etc. can be used herein to describe various elements, layers and/or sections, these elements, layers and/or sections should not be limited by these terms. These terms are only used to distinguish one element layer or section from another element, layer or section. Thus, a first element, layer or section discussed below could be termed a second element, layer or section without departing from the teachings of the present disclosure. For brevity, the terms "first", "second", etc. may not be used in the specification. The first element and/or the second element in claims can refer to any element that meets the description in the specification without departing from the spirit and scope of the invention as defined by the appended claims.

The terms "about" and "substantially" typically mean +/−15% of the stated value, for example, +/−10%, +/−5%, +/−3%, +/−2%, +/−1%, or +/−0.5% of the stated value. The stated value of the present disclosure is an approximate value. When there is no specific description to the terms "about" and "substantially", the stated value includes the meaning of "about" or "substantially". Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise. Moreover, for brevity, some elements can be suitably omitted in the figures.

The electronic device can include a display device, a backlight device, an antenna device, a sensing device, a tiled device, or an in-vehicle device, but it is not limited thereto. The electronic device can be a bendable, flexible, or extendable electronic device. The shape of the electronic device can be a rectangle, a circle, a polygon, a shape with a curved edge or curved surface, or other suitable shape. The electronic device can includes an electronic module, such as a display module, a backlight module, an antenna module, a sensing module, or other suitable module. The display device can be a non-self-emitting type display device or a self-emitting type display device. The antenna device can be a liquid crystal type antenna device or a non-liquid crystal type antenna device, the sensing device can be a sensing device for sensing capacitance, light, heat, or ultrasonic, but it is not limited thereto. The electronic device can include a passive element and an active element, such as a capacitance, a resistance, an inductance, a diode, a transistor, or etc. The diode can include a light-emitting diode or a photoelectric diode. For example, the light-emitting diode can include an organic light-emitting diode (OLED), a mini LED, a micro LED, or a quantum dot LED, but it is not limited thereto. The tiled device can be a tiled display device or a tiled antenna device, but it is not limited thereto. Moreover, the electronic device can selectively include a peripheral system, including a driving system, a controlling system, a light source system, or etc., to support the display device, the antenna device, the sensing device, the tiled device, or the in-vehicle device. The electronic device can be applied on an instrument panel or a central control board of a vehicle, but it is not limited thereto. It should be noted that, the electronic device can be a combination having one or more aforementioned devices, but it is not limited thereto.

Referring to FIG. 1, an electronic device E in an embodiment of the disclosure primarily includes a main structure 100, a first electronic module 300, a cover 400, a shield 500, a plurality of fixed members 600, and a plurality of circuit boards (including at least one first circuit board 710 and at least one second circuit board 720). In some embodiments, the electronic device E further includes a second electronic module 200 and at least one third circuit board 730. For example, each of the first electronic module 300 and the second electronic module 200 can be a display module, a backlight module, an antenna module, a sensing module, but it is not limited thereto. In this disclosure, the first electronic module 300 is a display module, and the second electronic module 200 is a backlight module. Thus, the main structure 100 is a frame to support or accommodate the first electronic module 300 and/or the second electronic module 200, and the second electronic module 200 and/or the first electronic module 300 can be disposed between the main structure 100 and the cover 400. In some embodiments, the first electronic module 300 is disposed between the second electronic module 200 and the cover 400. The cover 400 can include glass or other suitable material, but it is not limited thereto.

In some embodiments, the first electronic module 300 is a display module, and the second electronic module 200 is a backlight module. Therefore, the second electronic module 200 can provide light to the first electronic module 300, and the user can watch the image shown on the first electronic module 300 through the cover 400. For example, the second electronic module 200 can be a direct-type backlight module or a side-light type backlight module, and the first electronic module 300 can include a liquid crystal, a glass substrate, a color filter, and/or an alignment film, but it is not limited thereto. The second electronic module 200 can include a mini LED and/or a micro LED, but it is not limited thereto. In some other embodiments, the first electronic module 300 can include OLED, so that there is no need to use backlight module to provide light, and the user can directly watch the image shown on the first electronic module 300.

The circuit boards can be disposed on the main structure 100, and can be electrically connected to the second electronic module 200 and/or the first electronic module 300 to provide power and/or transmit signal to the second electronic module 200 and/or the first electronic module 300. For example, the first circuit board 710 can be electrically connected to the first electronic module 300, and the third circuit board 730 can be electrically connected to the second electronic module 200. In some embodiments, the first electronic module 300 includes the display function and the touch function, wherein the transmission of the touch signal can be processed by the second circuit board 720 or the touch circuit board 740, but it is not limited thereto. The circuit boards can be disposed between the main structure 100 and the shield 500, and the shield 500 can cover the circuit boards to prevent the circuit boards from damage due to the impact of the external component(s).

Figure 2:
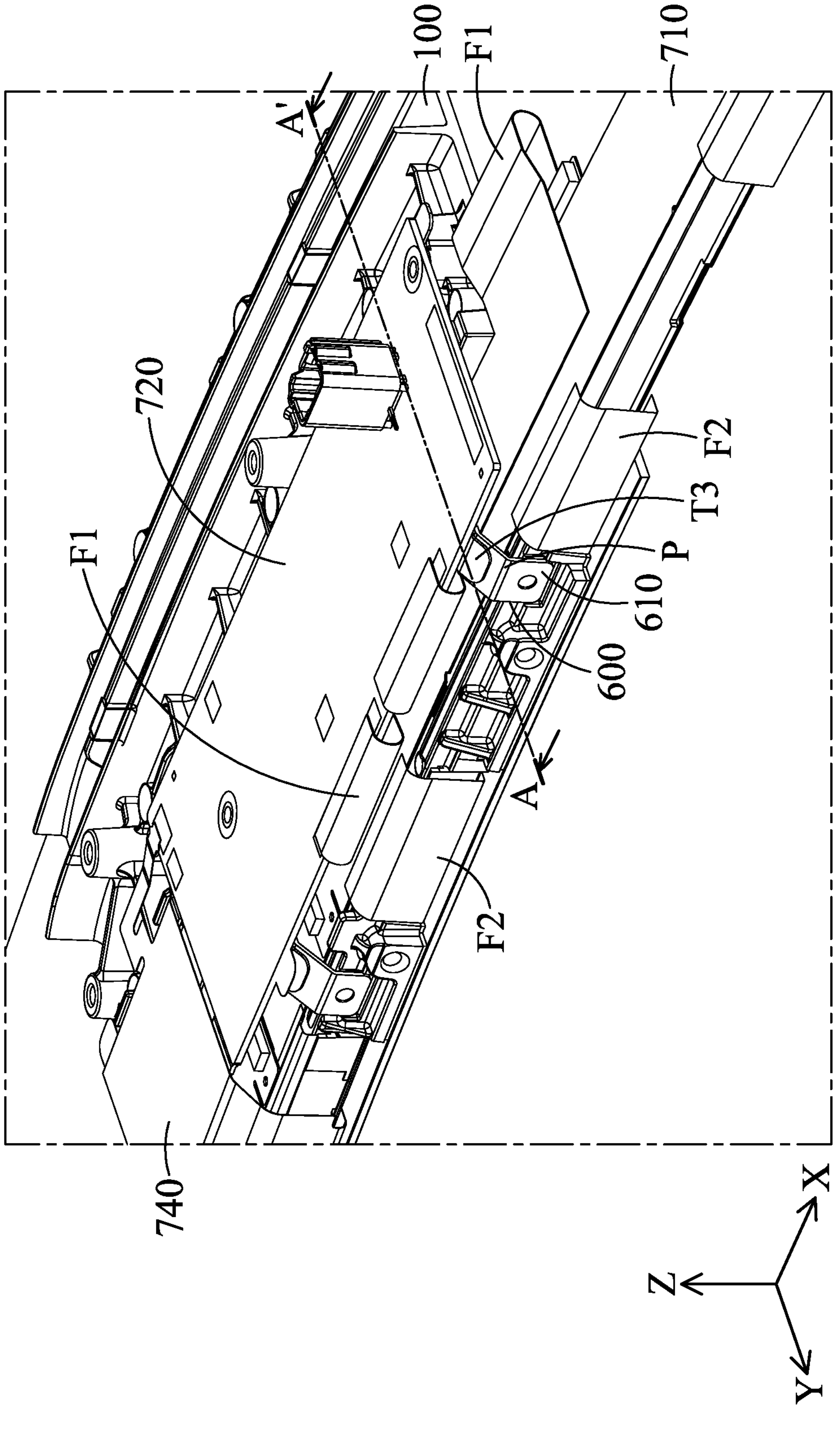
FIG. 2 is a partial schematic diagram of the electronic device according to an embodiment of the disclosure, wherein a shield of the electronic device is omitted.
Figure 3:
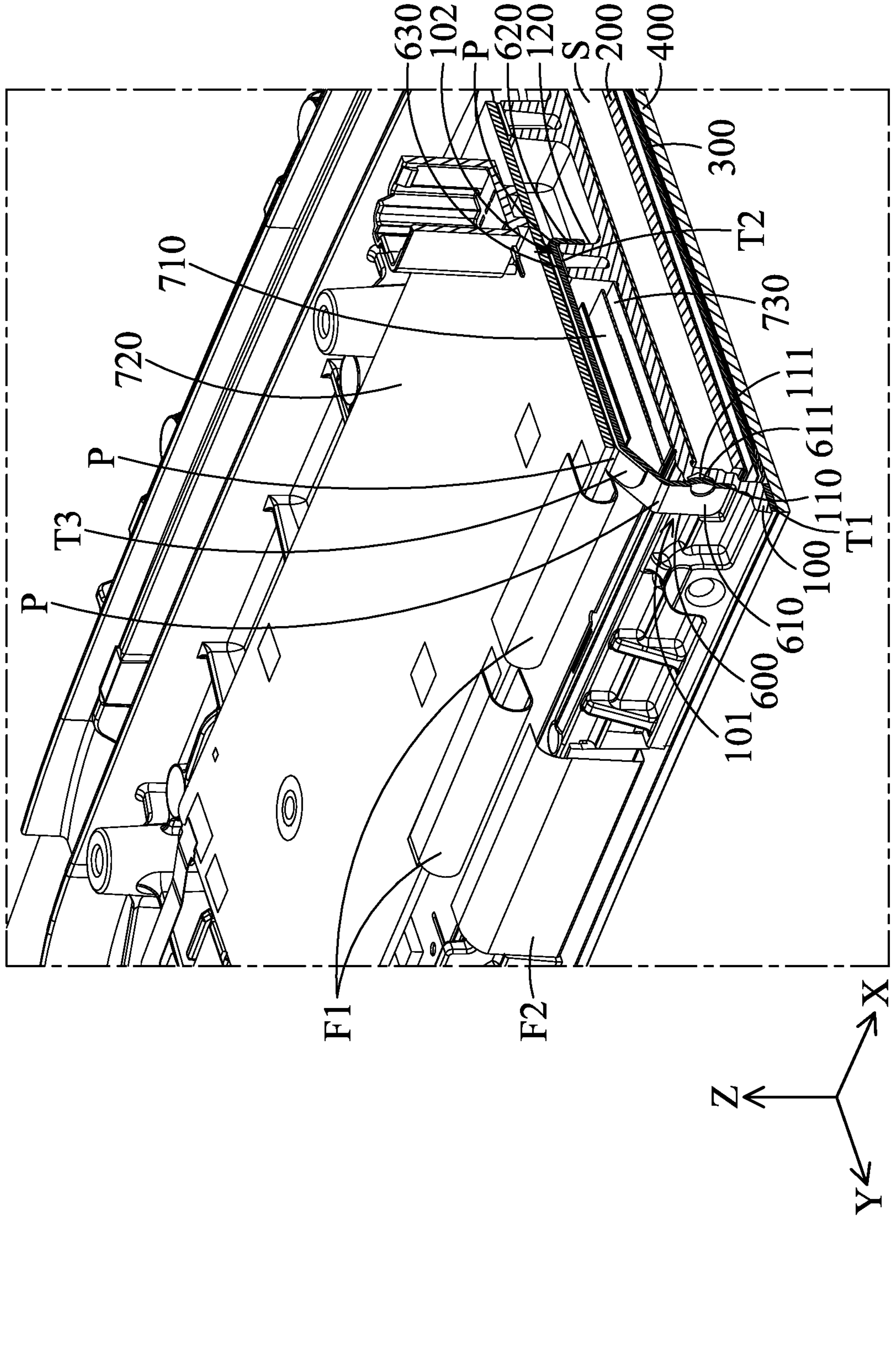
FIG. 3 is a cross-sectional view taken along the line A-A' in FIG. 2.

FIG. 2 is a partial schematic diagram of the electronic device E in which the shield 500 is omitted, and FIG. 3 is a cross-sectional view taken along the line A-A' in FIG. 2. As shown in FIG. 2 and FIG. 3, the main structure 100 includes an accommodating space S, the cover 400 is attached to the main structure 100 vie an adhesive member T1 (such as a glue or a tape) and seals an opening of the accommodating space S, and the second electronic module 200 and/or the first electronic module 300 are disposed in the accommodating space S.

The circuit boards are disposed on the backside of the main structure 100, and the fixed member 600 can form gaps between the circuit boards. For example, the second circuit board 720 can be disposed on the fixed member 600, the first circuit board 710 and the second circuit board 730 can be directly affixed to the main structure 100, the first circuit board 710 can be disposed between the fixed member 600 and the third circuit 730, and the fixed member 600 can be disposed between the second circuit board 720 and the first circuit board 710 and/or between the second circuit board 720 and third circuit board 730. In some embodiments, the first circuit board 710, the second circuit board 720, and the third circuit board 730 are overlapped with each other in the Z-axis.

The fixed member 600 is flexible, and can be divided into a first section 610, a second section 620, and the third section 630. The third section 630 is disposed between the first section 610 and the second section 630, and connects the first section 610 to the second section 630. It should be noted that, the extending direction of the third section 630 can be different from that of the first section 610 and the second section 620. In other words, at least one turning point P can be formed between the third section 630 and the first section 610, and at least one turning point P is formed between the third section 630 and the second section 620.

When the fixed member 600 is affixed to the main structure 100, the first section 610 can be in contact with a first surface 110 of the main structure 100, and the second section 620 can be in contact with a second surface 120 of the main structure 100. In some embodiments, the first surface 110 and the second surface 120 face the different directions. For example, the first surface 110 and the second surface 120 face the opposite directions (for instance, the first surface 110 and the second surface 120 respectively face the Y-axis direction and the Y-axis direction), but it is not limited thereto. The distance between the first surface 110 and the second surface 120 is substantially the same as the distance between the first section 610 and the second section 620, so that the fixed member 600 can be affixed to the main structure by the friction between the fixed member 600 and the main structure 100. The third section 630 can cross above the first circuit board 710 and/or the third circuit board 730. In some embodiments, a gap can be formed between the third section 630 and the first circuit board 710 and/or the third circuit board 730, but it is not limited thereto.

In this embodiment, a depression portion 111 is formed on the first surface 110 of the main structure 100, and a protruding portion 611 corresponding to the depression portion 111 is formed on the first section 610 of the fixed member 600. When the fixed member 600 is affixed to the main structure 100, the protruding portion 611 of the fixed member 600 enters the depression portion 111 of the main structure 100. Therefore, even if the electronic device E shakes, it can still ensure that the first section 610 of the fixed member 600 is affixed to a first fixing position 101 of the main structure 100. In some embodiments, the protruding portion is formed on the first surface 110 of the main structure, and the depression portion corresponding to the protruding portion is formed on the first section 610 of the fixed member 600. In some embodiments, the fixed member 600 is affixed to the first fixing position 101 of the main structure 100 by adhering, locking (such as the engagement of a hook and a slot), or screwing, but it is not limited thereto.

Moreover, an adhesive member T2 (such as a glue or a tape) can be used to adhere the main structure 100 and the second section 620 or adhere the main structure 100 and the portion of the third section 630 adjacent to the second section 620 to ensure that the fixed member 600 is affixed to a second fixing position 102 of the main structure 100. In some embodiments, the fixed member 600 is affixed to the second fixing position 102 of the main structure 100 by locking (such as the engagement of a hook and a slot, or the engagement of a depression portion and a protruding portion) or screwing, but it is not limited thereto.

The second circuit board 720 can be affixed to the third section 630 of the fixed member 600 by an adhesive member T3 (such as a glue or a tape), and can be electrically connected to the first circuit board 710 and/or the third circuit board 730 by at least one connecting member F1. Since the second circuit board 720 is affixed to the fixed member 600 by the adhesive member T3, the design of forming holes on the circuit board which is used to affix the circuit board by the locking members (such as the screws) can be prevented. Therefore, the usability of the circuit board can be increased, or the generation of the resonance frequency can be reduced. The connecting member F1 can pass through the gap between the second circuit board 720 and the first circuit board 710 and/or the gap between the second circuit board 720 and the third circuit board 730, so that the space in the electronic device E can be used more efficiently, and the miniaturization of the electronic device E is facilitated. In this embodiment, the connecting member F1 further passes the gap between the fixed member 600 and the first circuit board 710 and/or the gap between the fixed member 600 and the third circuit board 730.

The first circuit board 710 and the third circuit board 730 are affixed to the main structure 100, and the third circuit board 730 is disposed between the fixed member 600 and the first circuit board 710. The first circuit board 710 can be electrically connected to the first electronic module 300 via at least one connecting member F2, and the third circuit board 730 can be also electrically connected to the second electronic module 200 via at least one connecting member (not shown). In some embodiments, as observed from the Z-axis, the first circuit board 710 and the third circuit board 730 are not overlapped with the first fixing position 101 and the second fixing position 102.

In this embodiment, each of the first circuit board 710, the second circuit board 720, and the third circuit board 730 can include a printed circuit board (PCB) and components on the printed circuit board, each of the connecting member F1 and the connecting member F2 can include flexible printed circuit (FPC), but it is not limited thereto. In some embodiments, the touch circuit board 740 includes a flexible printed circuit and components on the flexible printed circuit.

Owing to the aforementioned structure, the first circuit board 710 and the second circuit board 720 and/or the second circuit board 720 and the third circuit board 730 can overlap each other as observed from the Z-axis, so that the inner space of the electronic device E can be used more efficiently, or the interference between the circuit boards and the interference between the circuit boards and the connecting members can be prevented. Moreover, since the second circuit board 720 is affixed above the first circuit board 710 and/or the third circuit board 730 by the fixed member 600, the design of forming holes on the circuit board which is used to affix the circuit board by the locking members (such as the screws) can be prevented. Therefore, the usability of the circuit board can be increased, or the generation of the resonance frequency can be reduced.

Figure 4:
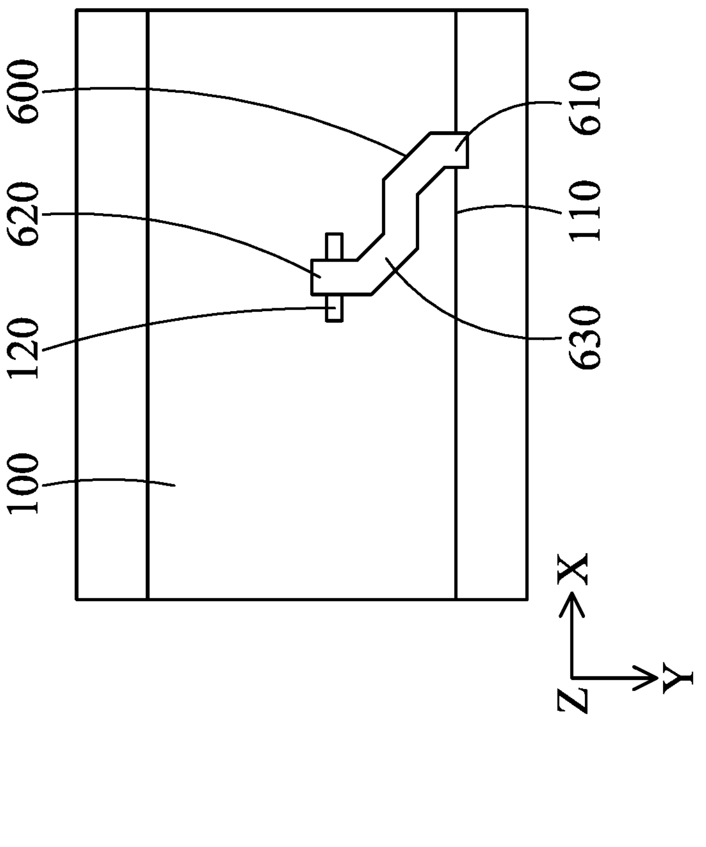
FIG. 4 is a schematic diagram of a fixed member according to another embodiment of the disclosure.

In the aforementioned embodiment, the fixed member 600 substantially has a longitudinal structure, but it is not limited thereto. The appearance of the fixed member 600 can be adjusted as required. For example, as shown in FIG. 4, in some embodiments, the third section 630 of the fixed member 600 can include a curved structure.

Figure 5:
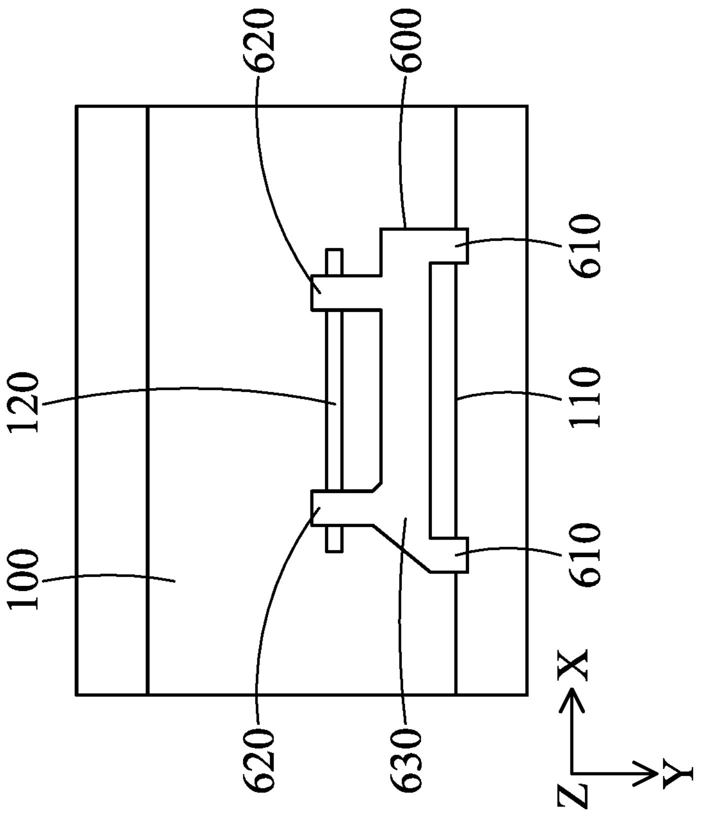
FIG. 5 is a schematic diagram of a fixed member according to another embodiment of the disclosure.

Furthermore, the numbers of the first section 610 and the second section 620 can be adjusted as required, and the first fixing position 101 and the second fixing position 102 of the main structure 100 can also be adjusted as required. For example, as shown in FIG. 5, in some embodiments, the fixing member 600 can include two first sections 610 and two second sections 620. In this embodiment, the third section 630 can include H-shaped structure.

In this disclosure, besides the numbers and the appearance of the fixed member 600 can be adjusted as required, the numbers of the first circuit board 710, the second circuit board 720, the third circuit board 730, the connecting member F1, and the connecting member F2 can also be adjusted as required.

The features between the aforementioned embodiments can be used or combined as long as they do not violate or conflict the spirit of the present application.

In summary, an embodiment of the disclosure provides an electronic device, including a main structure, a fixed member, a first circuit board, and a second circuit board. The main structure includes a first fixing position and a second fixing positing, and the fixed member is affixed to the first fixing position and the second fixing position. The first circuit board and the second circuit board are disposed on the main structure and overlapped with each other. The fixed member is disposed between the first circuit board and the second circuit board.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the disclosure has been described by way of example and in terms of preferred embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
- a main structure, comprising a first fixing position and a second fixing position;
- a fixed member, affixed to the first fixing position and the second fixing position;
- a first circuit board, disposed on the main structure; and
- a second circuit board, disposed on the main structure and overlapped with the first circuit board, wherein the fixed member is disposed between the first circuit board and the second circuit board;
- wherein the electronic device further comprises a first electronic module, and the first electronic module is electrically connected to the first circuit board;
- wherein the main structure comprises an accommodating space, and the first electronic module is disposed in the accommodating space.

2. The electronic device as claimed in claim 1, wherein the fixed member further comprises at least one turning point.

3. The electronic device as claimed in claim 1, wherein the first circuit board is electrically connected to the second circuit board.

4. The electronic device as claimed in claim 1, wherein the first circuit board does not overlap either of the first fixing position and the second fixing position.

5. The electronic device as claimed in claim 1, wherein the electronic device further comprises a third circuit board, and the third circuit board is disposed on the main structure and is electrically connected to the second circuit board.

6. The electronic device as claimed in claim 5, wherein the electronic device further comprises a second electronic module, and the second electronic module is electrically connected to the third circuit board.

7. The electronic device as claimed in claim 5, wherein the first circuit board is disposed between the fixed member and the third circuit board, and overlaps the second circuit board.

8. The electronic device as claimed in claim 1, wherein the fixed member is flexible.

9. The electronic device as claimed in claim 1, wherein the fixed member comprises a first section, a second section, and a third section, the third section connects the first section to the second section, and an extending direction of the third section is different from an extending direction of the first section and an extending direction of the second section.

10. The electronic device as claimed in claim 9, wherein the first section is affixed to the first fixing position, and the second section or a portion of the third section that is adjacent to the second section is affixed to the second fixing position.

11. The electronic device as claimed in claim 9, wherein the main structure has a first surface and a second surface, the first section is in contact with the first surface, the second section is in contact with the second surface, and the first surface and the second surface face different directions.

12. The electronic device as claimed in claim 11, wherein the first surface and the second surface face opposite directions.

13. The electronic device as claimed in claim 11, wherein a distance between the first surface and the second surface is substantially the same as a distance between the first section and the second section.

14. The electronic device as claimed in claim 11, wherein a protruding portion is formed on the first section, a depression portion is formed on the first surface, and the protruding portion enters the depression portion.

15. The electronic device as claimed in claim 9, wherein the third section includes a curved structure.

16. The electronic device as claimed in claim 9, wherein the fixed member further comprises a plurality of first sections and a plurality of third sections separated from each other.

17. The electronic device as claimed in claim 1, wherein the electronic device further comprises an adhesive member, and the fixed member is affixed to the second fixing position via the adhesive member.

18. An electronic device, comprising:
- a main structure, comprising a first fixing position and a second fixing position;
- a fixed member, affixed to the first fixing position and the second fixing position;
- a first circuit board, disposed on the main structure; and
- a second circuit board, disposed on the main structure and overlapped with the first circuit board, wherein the fixed member is disposed between the first circuit board and the second circuit board;
- wherein the electronic device further comprises a connecting member, the first circuit board is electrically connected to the second circuit board via the connecting member, and the connecting member passes through a gap between the fixed member and the first circuit board.

* * * * *